(12) United States Patent
Wang et al.

(10) Patent No.: US 12,484,396 B2
(45) Date of Patent: Nov. 25, 2025

(54) ARRAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Rong Wang, Beijing (CN); Donghui Tian, Beijing (CN); Fan He, Beijing (CN); Xiangdan Dong, Beijing (CN); Yu Wang, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/755,459

(22) PCT Filed: Apr. 30, 2021

(86) PCT No.: PCT/CN2021/091587
§ 371 (c)(1),
(2) Date: Apr. 29, 2022

(87) PCT Pub. No.: WO2022/227031
PCT Pub. Date: Nov. 3, 2022

(65) Prior Publication Data
US 2024/0155887 A1    May 9, 2024

(51) Int. Cl.
*H10K 59/131*    (2023.01)
*G09G 3/3225*    (2016.01)

(52) U.S. Cl.
CPC ......... *H10K 59/131* (2023.02); *G09G 3/3225* (2013.01)

(58) Field of Classification Search
CPC .. H01K 59/131; G09G 3/3225; G09G 3/3258; G09G 3/3266
See application file for complete search history.

(56) References Cited

U.S. PATENT DOCUMENTS

| 10,586,813 B2 | 3/2020 | Xu et al. |
| 10,644,037 B2 | 5/2020 | Su et al. |
| (Continued) | | |

FOREIGN PATENT DOCUMENTS

| CN | 111796462 A | 10/2010 |
| CN | 106647066 A | 5/2017 |
| (Continued) | | |

OTHER PUBLICATIONS

The Extended European Search Report dated Nov. 10, 2023; Appln. No. 21938505.1.

*Primary Examiner* — Sardis F Azongha
(74) *Attorney, Agent, or Firm* — Frank Gao, Esq.

(57) ABSTRACT

An array substrate and a display device. The array substrate includes a base substrate, a plurality of first pixel driving circuits, M first data lines, and M first leads; the base substrate includes a display region and a bonding region; the plurality of first pixel driving circuits are on the base substrate; the display region includes a first region and a second region, and the plurality of first pixel driving circuits are in the second region; the plurality of first pixel driving circuits are arranged in an array to constitute a plurality of first pixel driving columns; the M first data lines are configured to provide data signals to the plurality of first pixel driving columns, the M first leads are respectively connected with the M first data lines, pass through the first region from the second region and extend to the bonding region.

17 Claims, 9 Drawing Sheets

(56) References Cited

U.S. PATENT DOCUMENTS

| | | | |
|---|---|---|---|
| 10,761,386 B2* | 9/2020 | Zhang | G02F 1/13439 |
| 10,985,233 B2* | 4/2021 | Kang | G02F 1/1345 |
| 11,386,851 B2* | 7/2022 | Park | G09G 3/3275 |
| 11,521,545 B2* | 12/2022 | Cho | H01L 27/124 |
| 11,672,150 B2* | 6/2023 | Kang | H10K 59/40 |
| | | | 257/40 |
| 2010/0283955 A1 | 11/2010 | Kim et al. | |
| 2019/0278145 A1* | 9/2019 | Tanaka | G02F 1/136286 |
| 2020/0312927 A1* | 10/2020 | Bae | H10K 59/126 |
| 2020/0388230 A1 | 12/2020 | Lee | |
| 2021/0027717 A1 | 1/2021 | Kim | |
| 2021/0273035 A1* | 9/2021 | Cho | H10K 59/126 |
| 2021/0296424 A1 | 9/2021 | Cho et al. | |
| 2021/0391404 A1 | 12/2021 | Zhou et al. | |
| 2022/0037447 A1* | 2/2022 | Cho | H10K 59/88 |
| 2022/0069047 A1 | 3/2022 | Yang et al. | |

FOREIGN PATENT DOCUMENTS

| | | |
|---|---|---|
| CN | 107808886 A | 3/2018 |
| CN | 107870492 A | 4/2018 |
| CN | 108254984 A | 7/2018 |
| CN | 108363254 A | 8/2018 |
| CN | 111724742 A | 9/2020 |
| CN | 111916486 A | 11/2020 |
| CN | 112259592 A | 1/2021 |
| CN | 112310125 A | 2/2021 |
| EP | 3 832 728 A1 | 6/2021 |
| JP | 2018054786 A | 4/2018 |
| WO | 2020032338 A1 | 2/2020 |

* cited by examiner

ARRAY SUBSTRATE AND DISPLAY DEVICE

TECHNICAL FIELD

Embodiments of the present disclosure relate to an array substrate and a display device.

BACKGROUND

With the continuous development of display technology, people have higher and higher requirements for display quality of display devices. Organic light emitting diode (OLED) display devices are widely used because of their advantages of wide color gamut, fast response speed, flexible display, flexibility and high contrast.

On the other hand, people have higher and higher requirements for the overall effect and display effect of organic light emitting diode (OLED) display devices. Narrow frame design and rounded corner design can significantly improve the overall effect and display effect of the display devices, thus are gradually become a development direction of the market and a research focus of major manufacturers.

SUMMARY

Embodiments of the present disclosure provide an array substrate and a display device. In the array substrate, the plurality of first leads extend from the second region to pass through the first region and then extend to the bonding region, instead of extending from the second region directly to the bonding region, and the array substrate does not need to be provided with a wider frame outside the second region, thereby achieving a narrow frame design.

At least one embodiment of the present disclosure provides an array substrate, which comprises: a base substrate, comprising a display region and a bonding region at a periphery of the display region; a plurality of first pixel driving circuits on the base substrate; M first data lines; and M first leads, the display region comprises a first region and a second region at a side of the first region, and the plurality of first pixel driving circuits are in the second region, the plurality of first pixel driving circuits are arranged in an array along a first direction and a second direction to constitute a plurality of first pixel driving columns arranged along the first direction, the first region and the second region are arranged in the first direction, the M first data lines are configured to provide data signals to the plurality of first pixel driving columns, the M first leads are respectively connected with the M first data lines, pass through the first region from the second region and extend to the bonding region, and M is a positive integer greater than or equal to 2.

For example, in the array substrate provided by an embodiment of the present disclosure, the second region is closer to an edge of the array substrate than the first region in the first direction.

For example, in the array substrate provided by an embodiment of the present disclosure, an edge of an orthographic projection of the second region on the base substrate comprises a curve, and the curve is connected with an edge extending along the first direction of an orthographic projection of the first region on the base substrate.

For example, in the array substrate provided by an embodiment of the present disclosure, a first overlapping area of an orthographic projection of the bonding region on a reference line extending along the first direction and an orthographic projection of the first region on the reference line is larger than a second overlapping area of the orthographic projection of the bonding region on the reference line extending along the first direction and an orthographic projection of the second region on the reference line.

For example, in the array substrate provided by an embodiment of the present disclosure, the base substrate further comprises a bending region between the first region and the bonding region, and the bending region is bent so that the bonding region and the first region are respectively on two sides of the base substrate in a third direction, and the third direction is perpendicular to both the first direction and the second direction.

For example, the array substrate provided by an embodiment of the present disclosure further includes a plurality of second pixel driving circuits in the first region, each of the first leads comprises: a first sub-lead portion extending from the second region to the first region along the first direction; and a second sub-lead portion extending from the first region to the bonding region along the second direction.

For example, in the array substrate provided by an embodiment of the present disclosure, the plurality of first pixel driving circuits are arranged in an array along the first direction and the second direction to constitute a plurality of first pixel driving rows arranged along the second direction, the plurality of second pixel driving circuits are arranged in an array along the first direction and the second direction to constitute a plurality of second pixel driving columns arranged along the first direction and a plurality of second pixel driving rows arranged along the second direction, a first interval is between two of the first pixel driving rows that are adjacent in the second direction, and a second interval is between two of the second pixel driving columns that are adjacent in the first direction, and an orthographic projection of each of the first leads on the base substrate at least partially overlaps with an orthographic projection of the first interval and an orthographic projection of the second interval on the base substrate.

For example, in the array substrate provided by an embodiment of the present disclosure, the orthographic projection of each of the first leads on the base substrate falls within the first interval and the second interval.

For example, in the array substrate provided by an embodiment of the present disclosure, an orthographic projection of the first sub-lead portion on the base substrate at least partially overlaps with the orthographic projection of the first interval on the base substrate, an orthographic projection of the second sub-lead portion on the base substrate at least partially overlaps with the orthographic projection of the second interval on the base substrate.

For example, the array substrate provided by an embodiment of the present disclosure further comprises a first conductive layer, at a side of the plurality of first pixel driving circuits away from the base substrate; a first planarization layer, at a side of the first conductive layer away from the plurality of first pixel driving circuits; and a second conductive layer, at a side of the first planarization layer away from the first conductive layer, the first data lines are in the first conductive layer, and the first leads are in the second conductive layer.

For example, the array substrate provided by an embodiment of the present disclosure further comprising: a first conductive layer, at a side of the plurality of first pixel driving circuits away from the base substrate; a first planarization layer, at a side of the first conductive layer away from the plurality of first pixel driving circuits; a second conductive layer, at a side of the first planarization layer away from the first conductive layer; a gate layer, at a side of the first conductive layer close to the base substrate; an insulation structure layer, between the gate layer and the first conductive layer; a first via connection structure, in the insulation structure layer; and a second via connection structure, in the insulation structure layer, the first data lines are in the second conductive layer, the second sub-lead portion is in the second conductive layer, the first sub-lead portion is in the gate layer and connected with a corresponding one of the first data lines through the first via connection structure, and connected with the second sub-lead portion through the second via connection structure.

For example, in the array substrate provided by an embodiment of the present disclosure, lengths of first sub-lead portions of adjacent ones of the first leads are approximately equal.

For example, in the array substrate provided by an embodiment of the present disclosure, the display region comprises a third region, the third region is on a side of the first region away from the bonding region, and the array substrate further comprises a third pixel driving circuit which is in the third region, a size of each of the second pixel driving circuits in the first direction is smaller than a size of the third pixel driving circuit in the first direction, and a size of each of the first pixel driving circuits in the second direction is smaller than a size of the third pixel driving circuit in the second direction.

For example, the array substrate provided by an embodiment of the present disclosure further comprising: a plurality of first power lines, extending along the second direction; and a plurality of second power lines, extending along the second direction, the plurality of second pixel driving circuits are arranged in an array along the first direction and the second direction to constitute a plurality of second pixel driving rows arranged along the second direction and a plurality of second pixel driving columns arranged along the first direction, the plurality of first power lines are configured to provide power signals to the plurality of first pixel driving columns, and the plurality of second power lines are configured to provide power signals to the plurality of second pixel driving columns, and an orthographic projection of each of the first leads on the base substrate at least partially overlaps with an orthographic projection of one of the second power lines.

For example, the array substrate provided by an embodiment of the present disclosure further comprises: a plurality of initialization signal lines, extending along the first direction, the plurality of initialization signal lines are configured to provide initialization signals to the plurality of second pixel driving rows, and the orthographic projection of each first lead on the base substrate at least partially overlaps with an orthographic projection of one of the initialization signal lines on the base substrate.

For example, in the array substrate provided by an embodiment of the present disclosure, an orthographic projection of the first sub-lead portion on the base substrate at least partially overlaps with the orthographic projection of one of the initialization signal lines on the base substrate, and an orthographic projection of the second sub-lead portion on the base substrate at least partially overlaps with the orthographic projection of one of the second power lines on the base substrate.

For example, the array substrate provided by an embodiment of the present disclosure further comprises a first conductive layer, at a side of the plurality of first pixel driving circuits away from the base substrate; a first planarization layer, at a side of the first conductive layer away from the plurality of first pixel driving circuits; and a second conductive layer, at a side of the first planarization layer away from the first conductive layer, the plurality of first data lines and the plurality of power lines are all in the first conductive layer, and the first leads are in the second conductive layer.

For example, the array substrate provided by an embodiment of the present disclosure further comprises a first conductive layer, at a side of the plurality of first pixel driving circuits away from the base substrate; a first planarization layer, at a side of the first conductive layer away from the plurality of first pixel driving circuits; a second conductive layer, at a side of the first planarization layer away from the first conductive layer; and a second planarization layer, at a side of the second conductive layer away from the first planarization layer, the plurality of first data lines are in the first conductive layer or the second conductive layer, the first leads are at a side of the second planarization layer away from the second conductive layer, and a material of the first leads comprises a transparent conductive oxide material.

For example, the array substrate provided by an embodiment of the present disclosure further comprises N second data lines, in the first region; and N second leads, the plurality of second pixel driving circuits are arranged in an array along the first direction and the second direction to constitute a plurality of second pixel driving columns arranged along the first direction and a plurality of second pixel driving rows arranged along the second direction, the N second data lines are configured to provide data signals to the plurality of second pixel driving columns, and the N second leads are respectively connected with the N second data lines and extend from the first region to the bonding region, where N is a positive integer greater than or equal to M.

For example, in the array substrate provided by an embodiment of the present disclosure, among the N second leads, in a direction from the second region to the first region, the second lead connected to a j-th second data line of the N second data lines is a j-th second lead, and j is a positive integer greater than or equal to 1 and less than or equal to M, the j-th second lead comprises: a third sub-lead portion, in the first region and extending along the first direction; and a fourth sub-lead portion, connected with the third sub-lead portion and extending from the first region to the bonding region along the second direction.

For example, in the array substrate provided by an embodiment of the present disclosure, among the plurality of first leads, the first lead connected to a j-th first data line of the M first data lines is a j-th first lead, an orthographic projection of the second sub-lead portion of a (j+1)-th first lead on the base substrate is at a side of an orthographic projection of the second sub-lead portion of the j-th first lead on the base substrate away from the second region, an orthographic projection of the fourth sub-lead portion of the 1-st second lead on the base substrate is at a side of an orthographic projection of the second sub-lead portion of an M-th first lead on the base substrate away from the second region, and an orthographic projection of the fourth sub-lead portion of the (j+1)-th second lead on the base substrate is at a side of an orthographic projection of the fourth sub-lead portion of the j-th second lead on the base substrate away from the second region.

At least one embodiment of the present disclosure further provides a display device, comprising any one of the above-mentioned array substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
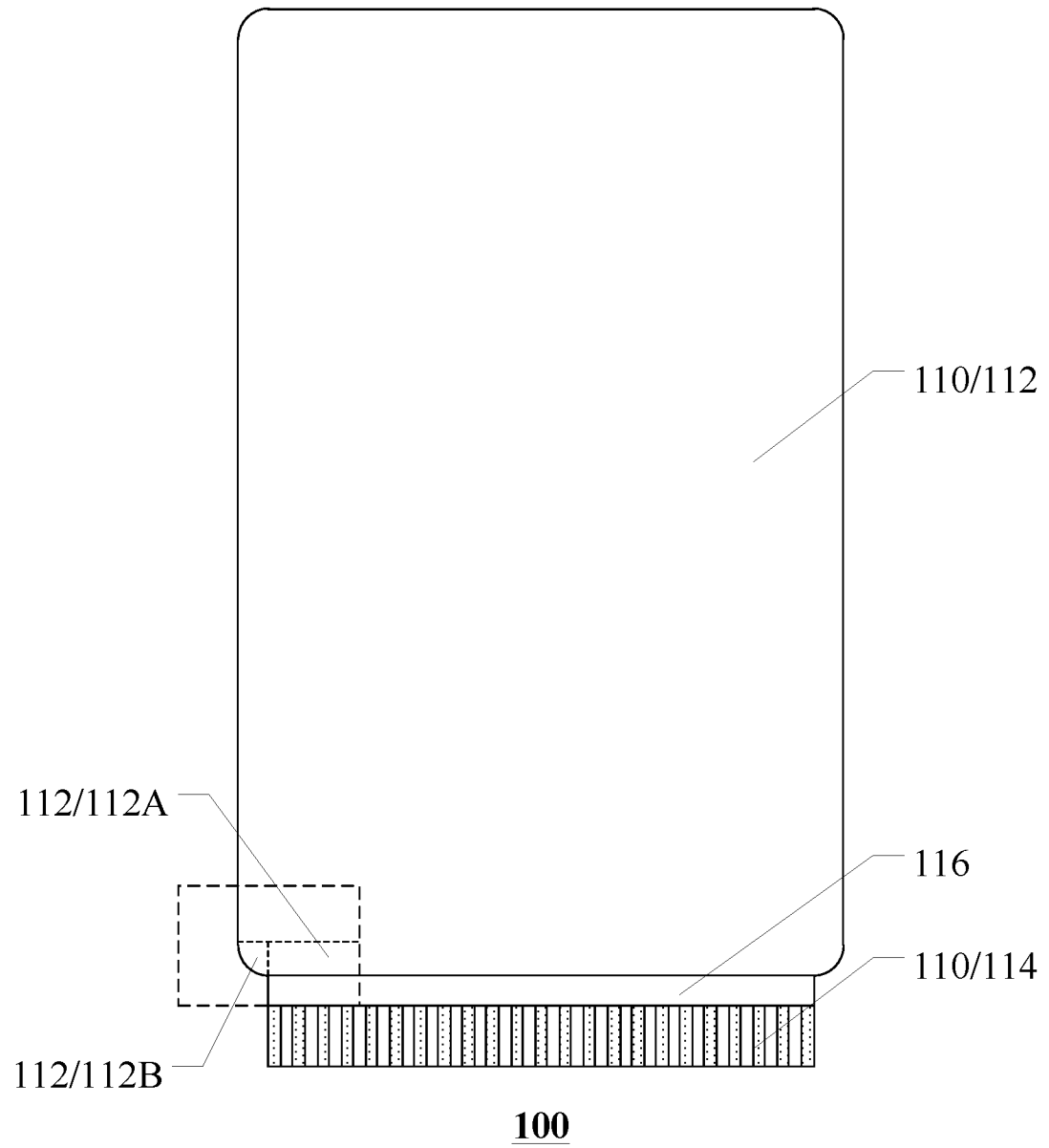
FIG. 1 is a schematic planar view of an array substrate provided by an embodiment of the disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "comprise," "comprising," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly.

In order to meet people's higher and higher requirements for the overall display effect and display effect of display devices, narrow frame design and rounded corner design are gradually applied in display devices, such as smart phones. However, the display panel with rounded corner design needs to be routed outside the rounded corner region, so the common display device needs a wider frame outside the rounded corner region.

Therefore, embodiments of the present disclosure provide an array substrate and a display device. The array substrate includes a base substrate, a plurality of first pixel driving circuits, M first data lines, and M first leads; the base substrate includes a display region and a bonding region at a periphery of the display region; the plurality of first pixel driving circuits are on the base substrate; the display region includes a first region and a second region at a side of the first region, and the plurality of first pixel driving circuits are in the second region; the plurality of first pixel driving circuits are arranged in an array along a first direction and a second direction to constitute a plurality of first pixel driving columns arranged along the first direction; the M first data lines are configured to provide data signals to the plurality of first pixel driving columns, the M first leads are respectively connected with the M first data lines, pass through the first region from the second region and extend to the bonding region, and M is a positive integer greater than or equal to 2. Therefore, the plurality of first leads extend from the second region to pass through the first region and then extend to the bonding region, instead of extending from the second region directly to the bonding region, and the array substrate does not need to be provided with a wider frame outside the second region, thereby achieving a narrow frame design.

Hereinafter, the array substrate and the display device provided by the embodiment of the present disclosure will be described in detail with reference to the drawings.

Figure 2:
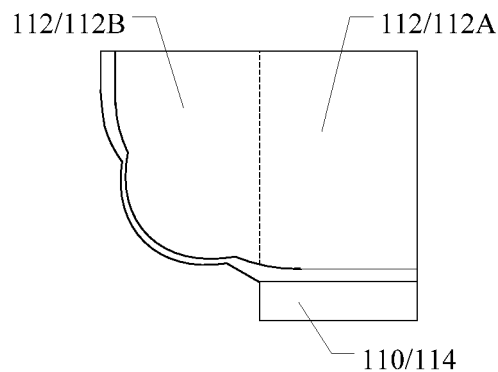
FIG. 2 is an enlarged schematic diagram of the dotted line frame in the array substrate illustrated in FIG. 1.
Figure 3A:
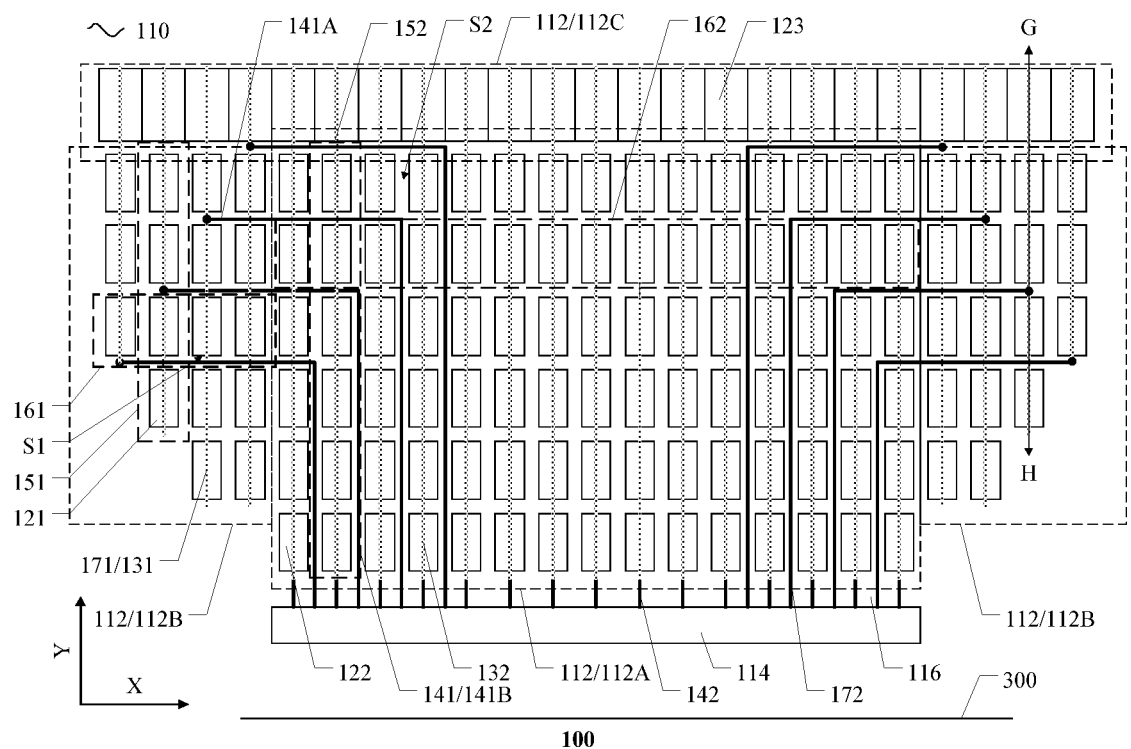
FIG. 3A is a partial schematic diagram of an array substrate provided by an embodiment of the disclosure.
Figure 3B:
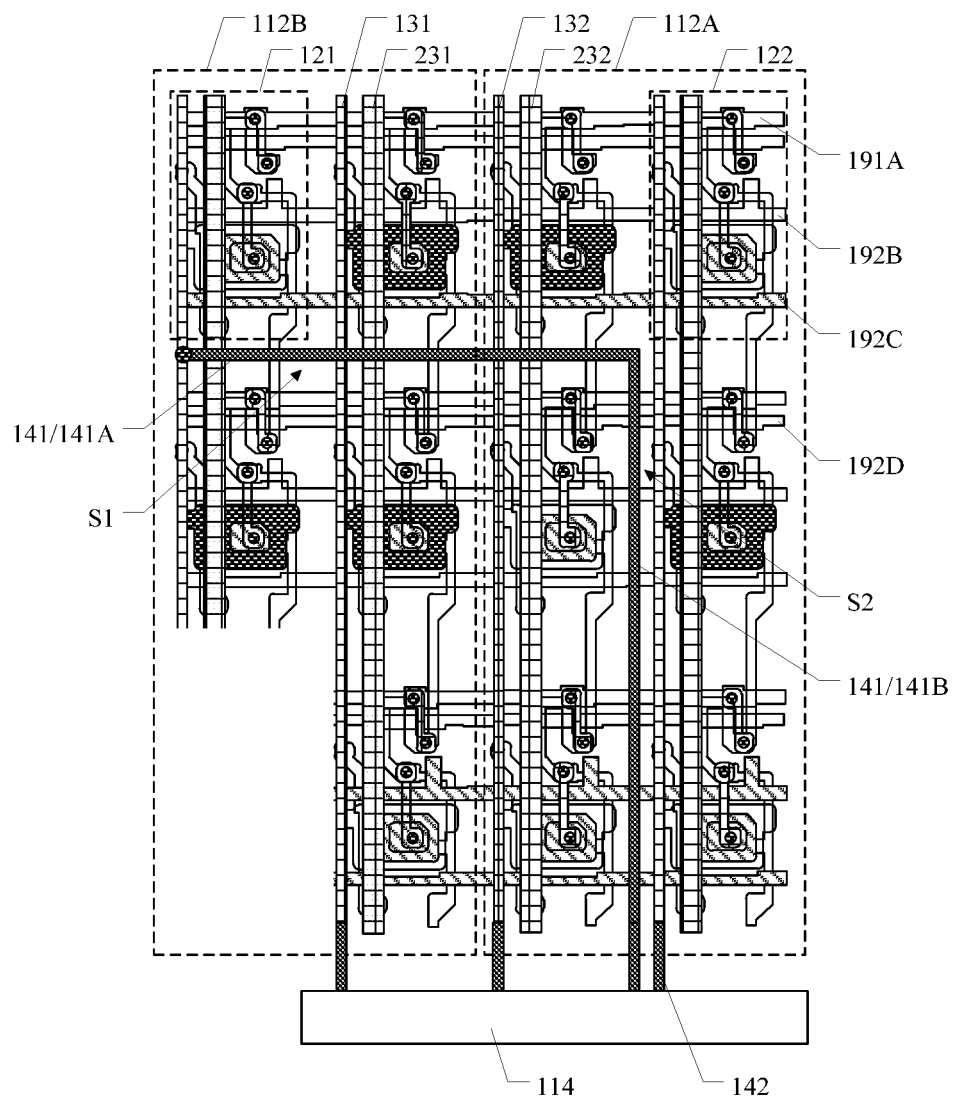
FIG. 3B is a partial schematic diagram of another array substrate provided by an embodiment of the disclosure.

At least one embodiment of the present disclosure provides an array substrate. FIG. 1 is a schematic planar view of an array substrate provided by an embodiment of the disclosure; FIG. 2 is an enlarged schematic diagram of the dotted line frame in the array substrate illustrated in FIG. 1; FIG. 3A is a partial schematic diagram of an array substrate provided by an embodiment of the disclosure; FIG. 3B is a partial schematic diagram of another array substrate provided by an embodiment of the disclosure.

As illustrated in FIG. 1, FIG. 2 and FIG. 3A, the array substrate 100 includes a substrate 110, a plurality of first pixel driving circuits 121, M first data lines 131 and M first leads 141; the base substrate 110 includes a display region 112 and a bonding region 114 located at a periphery of the display region 112. The display region 112 includes a first region 112A and a second region 112B at a side of the first region 112A, and the plurality of first pixel driving circuits 121 are located in the second region 112B. The first region 112A and the second region 112B are arranged in the first direction. For example, the bonding region 114 may be located below the display region 112, the bonding region 114 may be used to connect with an external driver IC, and the driver IC can provide data signals to the plurality of first data lines 131 through the plurality of first leads 141, thereby driving the array substrate to display.

As illustrated in FIG. 1, FIG. 2 and FIG. 3A, the plurality of first pixel driving circuits 121 are arranged in an array along the first direction X and the second direction Y to constitute a plurality of first pixel driving columns 151 arranged along the first direction X, and each first pixel driving column 151 extends along the second direction Y, that is, the plurality of first pixel driving circuits 121 in each first pixel driving column 151 are arranged along the second direction Y. The M first data lines 131 are configured to provide data signals to the plurality of first pixel driving columns 151, and the M first leads 141 are respectively connected to the M first data lines 131, pass through the first region 112A from the second region 112B and extend to the bonding region 114, and M is a positive integer greater than or equal to 2. It should be noted that one first data line 131 can drive one first pixel driving column 151, and one first data line 131 can also drive multiple first pixel driving columns 151 in a manner of time-sharing driving.

Figure 4:
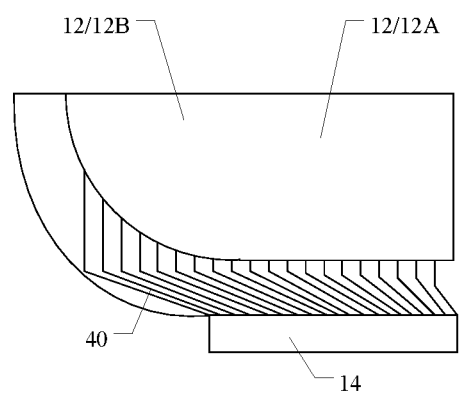
FIG. 4 is a partial schematic diagram of an array substrate.

FIG. 4 is a partial schematic diagram of an array substrate. As illustrated in FIG. 4, the array substrate 10 uses leads 40 to connect the data lines in the display region 12 with the bonding region 14, so that data signals can be provided to the pixel driving circuits in the display region 12 through the bonding region 14 and the leads 40. In this array substrate 10, a large number of leads 40 need to be arranged outside a rounded corner region 12B of the display region 12, and these leads 40 are required to be bent to be connected to the bonding region, therefore a wider frame is required outside the rounded corner region 12B for the leads 40 to be routed. On the other hand, in this array substrate 10, because it is necessary to avoid the leads 40 of the rounded corner region 12B, the leads 40 of a rectangular region 12A of the display region 12 also required to be bent to be connected to the bonding region, therefore a wider frame is also required outside the rectangular region 12A of the display region 12.

However, as illustrated in FIG. 2 and FIG. 3A, in the array substrate provided by at least one embodiment of the present disclosure, the M first data lines 131 are configured to provide data signals to the plurality of first pixel driving columns 151, and the M first leads 141 are respectively connected with the M first data lines 131, pass through the first region 112A from the second region 112B and extend to the bonding region 114, so that the M first leads 141 can provide driving signals to the M first data lines 131, for example, data signals. The M first leads 141 pass through the first region 112A from the second region 112B and extend to the bonding region 114, instead of extending from the second region directly to the bonding region, therefore the array substrate does not need to be provided with a wider frame outside the second region, so that a narrow frame or even no frame design can be achieved outside the second region. In addition, because the plurality of first leads 141 can directly extend from the first region 112A to the bonding region 114, without being bent outside the first region 112A, the width of the frame outside the first region can also be reduced. Therefore, the array substrate has a smaller frame width at a side of the display region close to the bonding region, so that a narrow frame design and an ultra-narrow frame design can be achieved.

On the other hand, because the array substrate has a narrow frame outside the second region, and the frame at that position is not provided with the first lead, the second region of the array substrate can be bent at a large angle, so that the "four-curved-surface screen" design can be achieved, and wrinkles can be avoided in the subsequent module bonding process, thereby improving the product yield. It should be noted that the design of "four-curved-surface screen" is to bend edges and corners of the array substrate according to a certain bending radius and form a curved surface, so as to realize full stereoscopic display of the front side and the lateral sides, thus achieving a 3D stereoscopic effect of a four-curved-surface shape, thus creating a display stereoscopic immersion feeling, which is in line with the future technical development trend.

In some examples, as illustrated in FIG. 1, FIG. 2 and FIG. 3A, the second region 112B is closer to the edge of the array substrate 110 than the first region 112A in the first direction X.

In some examples, as illustrated in FIG. 1, FIG. 2 and FIG. 3A, a shape of an orthographic projection of the first region 112A on the base substrate 110 is rectangular, and a shape of the orthographic projection of the second region 112B on the base substrate 110 is irregular. Therefore, the array substrate can realize a round corner design in the corner, thereby improving the display effect of the array substrate. It should be noted that the irregular shape can be non-rectangular.

For example, as illustrated in FIG. 1, FIG. 2 and FIG. 3A, the first region 112A may be a region above the straight edge of the bottom edge of the array substrate 100, and the second region 112B may be located at the corner of the array substrate 100, and the number of sub-pixels in the sub-pixel column in the second region 112B is smaller than the number of sub-pixels in the sub-pixel column in the first region 112A. In some examples, as illustrated in FIG. 1, FIG. 2 and FIG. 3A, an edge of an orthographic projection of the second region 112B on the base substrate 110 includes a curve, and the curve is connected with an edge extending along the first direction X of an orthographic projection of the first region 112A on the base substrate 110. Therefore, the array substrate can realize a display region in a irregular shape.

In some examples, as illustrated in FIG. 1, FIG. 2 and FIG. 3A, a first overlapping area of an orthographic projection of the bonding region 114 on a reference line 300 extending along the first direction X and an orthographic projection of the first region 112A on the reference line 300 is larger than a second overlapping area of the orthographic projection of the bonding region 114 on the reference line 300 extending along the first direction X and an orthographic projection of the second region 112B on the reference line 300. Even the orthographic projection of the bonding region 114 on the reference line 300 extending along the first direction X does not overlap with the orthographic projection of the second region 112B on the reference line 300. Therefore, after the first lead comes out of the first region 112A, the first lead may extend to the bonding region 114 without being bent outside the first region 112A, so the width of the frame outside the first region can also be reduced.

In some examples, as illustrated in FIG. 1, FIG. 2 and FIG. 3A, the array substrate 100 further includes a plurality of second pixel driving circuits 122, N second data lines 132 and N second leads 142; the plurality of second pixel driving circuits 122 are located in the first region 112A; the plurality of second pixel driving circuits 122 are arranged in an array along the first direction X and the second direction Y to constitute a plurality of second pixel driving columns 152 arranged along the first direction X, and each second pixel driving column 152 extends along the second direction Y. The N second data lines 132 are configured to provide data signals to the plurality of second pixel driving columns 152, and the N second leads 142 are respectively connected with the N second data lines 132 and extend from the first region 112A to the bonding region 114, and N is a positive integer greater than or equal to M.

In some examples, as illustrated in FIG. 1, FIG. 2 and FIG. 3A, each first lead 141 includes a first sub-lead portion 141A and a second sub-lead portion 141B; the first sub-lead portion 141A extends along the first direction X, and the second sub-lead portion 141B extends along the second direction Y. The first sub-lead portion 141A extends from the second region 112B to the first region 112A along the first direction X; the second sub-lead portion 141B extends from the first region 112A to the bonding region 114 along the second direction Y. Of course, embodiments of the present disclosure include, but are not limited to this case, the plurality of first sub-lead portions 141A and the plurality of second sub-lead portions 141B may form a step-shaped first lead 141.

In some examples, as illustrated in FIG. 1, FIG. 2 and FIG. 3A, two sides of the first region 112A may be respectively provided with one second region 112B, that is, one second region 112B is provided on a first side of the first region 112A, and another second region 112B is provided on a second side of the first region 112A opposite to the first side.

In some examples, as illustrated in FIG. 1, FIG. 2 and FIG. 3A, for one second region 112B, among the plurality of first leads 141 in the second region 112B, in the direction from the second region 112B to the first region 112A, the first lead 141 connected with an i-th first data line 131 is an i-th first lead 141; among the plurality of second leads 142, in the direction from the second region 112B to the first region 112A, the second lead 142 connected to an i-th second data line 132 is an i-th second lead 142; the second sub-lead portion 141B of the i-th first lead 141 is located between the i-th second lead 142 and an (i+1)-th second lead 143, and i is a positive integer greater than or equal to 1 and less than or equal to M. That is, the second sub-lead portion 141B of the i-th first lead 141 can be inserted between the i-th second lead 142 and the (i+1)-th second lead 143. In this case, the array substrate can be driven by adjusting the structure or the driving method of the driver IC.

In some examples, as illustrated in FIG. 1, FIG. 2 and FIG. 3A, a plurality of first pixel driving circuits 121 are arranged in an array along the first direction X and the second direction Y to constitute a plurality of first pixel driving rows 161 arranged along the second direction Y, each first pixel driving row 161 extends along the first direction X and may include a plurality of first pixel driving circuits 121 arranged along the first direction X. The plurality of second pixel driving circuits 122 are arranged in an array along the first direction X and the second direction Y to constitute a plurality of second pixel driving columns 152 arranged along the first direction X and a plurality of second pixel driving rows 162 arranged along the second direction Y; a first interval S1 is between two first pixel driving rows 161 that are adjacent in the second direction Y and a second interval S2 is between two second pixel driving columns 152 that are adjacent in the first direction X. An orthographic projection of each first lead 141 on the base substrate 110 at least partially overlaps with an orthographic projection of the first interval S1 and the second interval S2 on the base substrate 110. Therefore, the array substrate can be provided with the above-mentioned first leads by utilizing the intervals between pixel driving circuits, so that the first leads can extend from the second region to the first region and then to the bonding region. In addition, the array substrate can prevent signals on the first leads from causing crosstalk and other adverse effects on the first pixel driving circuits.

In some examples, as illustrated in FIG. 1, FIG. 2 and FIG. 3A, the orthographic projection of each first lead 141 on the base substrate 110 falls within the orthographic projection of the first interval S1 and the second interval S2 on the base substrate 110. Therefore, the array substrate can better prevent the signals on the first leads from causing crosstalk and other adverse effects on the first pixel driving circuits. Of course, embodiments of the present disclosure include, but are not limited to this case, the orthographic projection of each first lead on the base substrate may also partially fall with the orthographic projection of the first interval and the second interval on the base substrate.

In some examples, as illustrated in FIG. 1, FIG. 2 and FIG. 3A, an orthographic projection of the first sub-lead portion 141A on the base substrate 110 at least partially overlaps with the orthographic projection of the first interval S1 on the base substrate 110; the orthographic projection of the second sub-lead portion 141B on the base substrate 110 at least partially overlaps with the orthographic projection of the second interval S2 on the base substrate 110.

It is worth noting that the above-mentioned first pixel driving circuit and second pixel driving circuit may each include a plurality of transistors and a storage capacitor; in this case, respective size ranges of the first pixel driving circuit and the second pixel driving circuit may be circumscribed rectangles respectively of an orthographic projection of the plurality of transistor and the storage capacitor in the pixel driving circuit on the base substrate 110, and thus can be used for determining the above-mentioned first interval S1 and second interval S2. In addition, in the case that the pixels per inch of the array substrate is low, the above-mentioned first interval S1 and second interval S2 may be formed by compressing the size of the first pixel driving circuit.

In some examples, as illustrated in FIG. 1, FIG. 2 and FIG. 3A, in the array substrate 100, the display region 112 further includes a third region 112C, the third region 112C is located on a side of the first region 112A away from the bonding region 114. The array substrate 100 further includes a third pixel driving circuit 123 located in the third region 112C. A size of the second pixel driving circuit 122 in the first direction X is smaller than that of the third pixel driving circuit 123 in the first direction X, and a size of the first pixel driving circuit 121 in the second direction Y is smaller than that of the third pixel driving circuit 123 in the second direction Y. Therefore, the first interval S1 and the second interval S2 described above can be formed by compressing the size of the first pixel driving circuit. It should be noted that the embodiments of the present disclosure includes but are not limited to this case, and the size of the third pixel driving circuit in the third region may be the same as the size of the first pixel driving circuit.

In some examples, as illustrated in FIG. 1, FIG. 2 and FIG. 3A, the size of the first pixel driving circuit 121 in the first direction X is smaller than that of the third pixel driving circuit 123 in the first direction X, and the size of the first pixel driving circuit 121 in the second direction Y is smaller than that of the third pixel driving circuit 123 in the second direction Y; furthermore, the size of the second pixel driving circuit 122 in the first direction X is smaller than that of the third pixel driving circuit 123 in the first direction X, and the size of the second pixel driving circuit 122 in the second direction Y is smaller than that of the third pixel driving circuit 123 in the second direction Y.

In some examples, as illustrated in FIG. 3B, the array substrate 100 further includes an initialization signal line 191A, a gate line 192B, a light emission control line 192C and a reset signal line 192D that extend along the first direction X; in this array substrate 100, although the size of the first pixel driving circuit 121 and the size of the second pixel driving circuit 122 are reduced, the initialization signal line 191A, the gate line 192B, the light emission control line 192C and the reset signal line 192D that extend along the first direction X still need to extend in the whole display region 112 to respectively apply corresponding signals to the first pixel driving circuits 121 and the second pixel driving circuits 122. Therefore, as illustrated in FIG. 3B, the orthographic projection of the second sub-lead portion 141B of the first lead 141 on the base substrate 110 overlaps with orthographic projections of the initialization signal line 191A, the gate line 192B, the light emission control line 192C and the reset signal line 192D on the base substrate 110.

For example, the initialization signal line 191A can respectively apply an initialization signal to the respective first pixel driving circuit 121 and the respective second pixel driving circuit 122; the gate lines 192B can respectively apply a gate signal to the respective first pixel driving circuit 121 and the respective second pixel driving circuit 122; the light emission control line 192C can respectively apply a light emission control signal to the respective first pixel driving circuit 121 and the respective second pixel driving circuit 122; the reset signal line 192D can respectively apply a reset signal to the respective first pixel driving circuit 121 and the respective second pixel driving circuit 122.

In some examples, as illustrated in FIG. 3B, the array substrate 100 further includes a first data line 131, a second data line 132, a first power line 231 and a second power line 232 that extend along the second direction Y; in this array substrate 100, although the size of the first pixel driving circuit 121 and the size of the second pixel driving circuit 122 are reduced, the first data line 131, the second data line 132, the first power line 231 and the second power line 232 that extend along the second direction Y still need to extend in the whole display region 112 to respectively apply corresponding signals to the first pixel driving circuits 121 and the second pixel driving circuits 122. Therefore, as illustrated in FIG. 3B, an orthographic projection of the first sub-lead portion 141A of the first lead 141 on the base substrate 110 overlaps with an orthographic projection of the first data line 131, the second data line 132, the first power line 231 and the second power line 232 on the base substrate 110. In this case, the first lead and the data line and the power line need to be arranged in different conductive layers.

Figure 5:
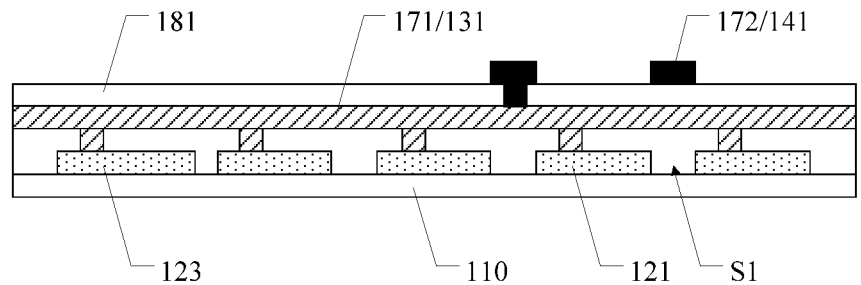
FIG. 5 is a schematic sectional view of an array substrate taken along the direction GH in FIG. 3A provided by an embodiment of the present disclosure.

FIG. 5 is a schematic cross-sectional view of an array substrate taken along the direction GH in FIG. 3A provided by an embodiment of the disclosure. As illustrated in FIG. 3A and FIG. 5, the array substrate 100 further includes a first conductive layer 171, a first planarization layer 181 and a second conductive layer 172; the first conductive layer 171 is located at a side of the first pixel driving circuits 121 away from the base substrate 110; the first planarization layer 181 is located on a side of the first conductive layer 172 away from the first pixel driving circuits 121; the second conductive layer 172 is located on a side of the first planarization layer 181 away from the first conductive layer 171; the plurality of first data lines 131 are located in the first conductive layer 171, and the plurality of first leads 141 are located in the second conductive layer 172. Therefore, the array substrate can form the first data lines by the first conductive layer and the first leads by the second conductive layer, so that the first leads can be manufactured without additional masking process, and the cost can be reduced. On the other hand, because the square resistance of the second conductive layer itself is small, the load or delay of the first leads can be reduced.

It should be noted that in the case that the array substrate includes the second pixel driving circuits or the third pixel driving circuit, the first conductive layer may also be located at a side of the second pixel driving circuit away from the base substrate or a side of the third pixel driving circuit away from the base substrate.

For example, the first conductive layer 171 may be made of a conductive metal; for example, the first conductive layer 171 may be a stack of titanium/aluminum/titanium. Of course, the embodiments of the present disclosure include but are not limited to this case, and the first conductive layer may also be made of other suitable conductive materials.

For example, the second conductive layer 172 may also be made of a conductive metal; for example, the second conductive layer 172 may also be a stack of titanium/aluminum/titanium. Of course, the embodiments of the present disclosure include but are not limited to this case, and the second conductive layer may also be made of other suitable conductive materials.

For example, the first planarization layer 181 may be made of an organic insulation material such as polyimide, resin, and the like. Of course, the embodiments of the present disclosure include but are not limited to this case, and the first planarization layer may also be made of inorganic insulation materials.

Figure 6:
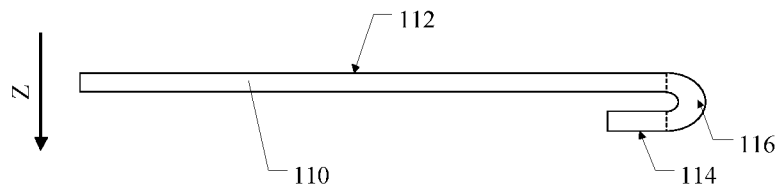
FIG. 6 is a schematic diagram of another array substrate provided by an embodiment of the disclosure.

FIG. 6 is a schematic diagram of another array substrate provided by an embodiment of the disclosure. As illustrated in FIG. 6, the base substrate 110 further includes a bending region 116 located between the first region 112A and the bonding region 114; the bending region 116 is bent so that the bonding region 114 and the first region 112A are respectively located on two sides of the base substrate 110 in the third direction Z, and the third direction Z is perpendicular to both the first direction X and the second direction Y. That is, the base substrate may include a display side and a back side opposite to the display side, both the first region and the second region are on the display side, and the bending region is bent to the back to enable the bonding region to be on the back side. Therefore, the array substrate can further reduce the width of the frame, thereby achieving the ultra-narrow frame design.

For example, the base substrate 110 may be a flexible substrate, and the base substrate 110 may be made of a flexible material such as polyimide, and the like. Of course, the embodiments of the present disclosure include but are not limited to this case, and the base substrate 110 may be a rigid substrate, such as a glass substrate, a quartz substrate, a hard plastic substrate, etc.

Figure 7:
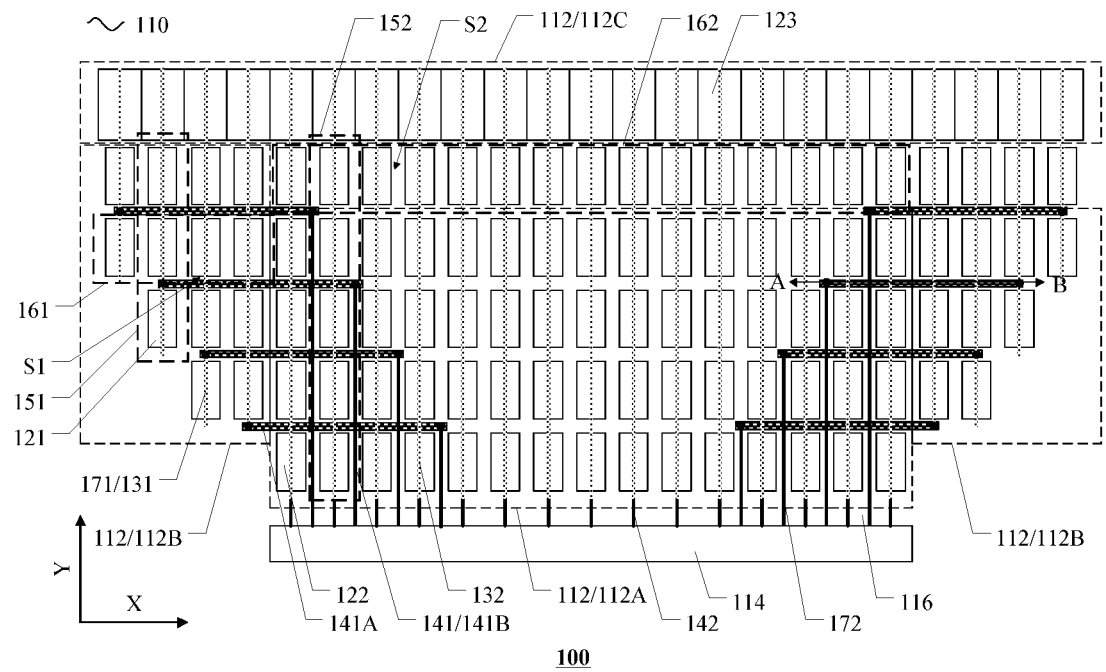
FIG. 7 is a schematic diagram of further another array substrate provided by an embodiment of the disclosure.
Figure 8:
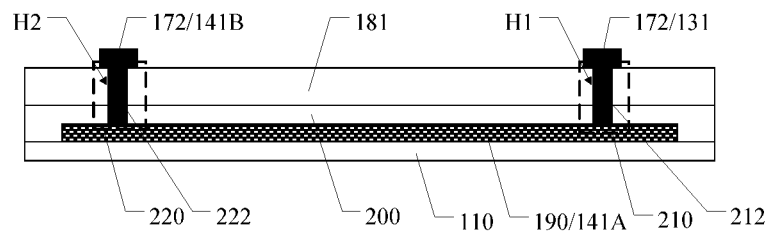
FIG. 8 is a schematic sectional view of an array substrate taken along the direction AB in FIG. 7 provided by an embodiment of the present disclosure.

FIG. 7 is a schematic diagram of further another array substrate provided by an embodiment of the disclosure; FIG. 8 is a schematic cross-sectional view of an array substrate taken along the direction AB in FIG. 7 provided by an embodiment of the disclosure.

In some examples, as illustrated in FIG. 7 and FIG. 8, the array substrate 100 includes a first conductive layer 171, a first planarization layer 181, a second conductive layer 172, a gate layer 190 and an insulation structure layer 200; the first conductive layer 171 is located at a side of the first pixel driving circuits 121 away from the base substrate 110; the first planarization layer 181 is located on aside of the first conductive layer 172 away from the first pixel driving circuits 121; the second conductive layer 172 is located on a side of the first planarization layer 181 away from the first conductive layer 171; the gate layer 190 is located on a side of the first conductive layer 171 close to the base substrate 110; the insulation structure layer 200 is between the gate layer 190 and the first conductive layer 171.

In some examples, as illustrated in FIG. 4 and FIG. 5, the array substrate 100 further includes a first via connection structure 210 and a second via connection structure 220; both the first via connection structure 210 and the second via connection structure 220 are in the insulation structure layer 200. The plurality of first data lines 131 are in the second conductive layer 172, the second sub-lead portions 141B are in the second conductive layer 172, the first sub-lead portions 141A are in the gate layer 190, connected with the corresponding first data lines 141 through the first via connection structure 210, and connected with the second sub-lead portions 141B through the second via connection structure 220. The array substrate can use the gate layer to constitute the first sub-lead portion extending along the first direction of the first lead; because the second sub-lead portion extends along the second direction, the second sub-lead portion cannot collide with the data line and the power line in the second conductive layer, and the first data line can be formed in the second conductive layer. Therefore, the array substrate can form the first data line in the second conductive layer, thereby reducing the load of the first data line. On the other hand, because the square resistance of the gate layer and the second conductive layer are both small, the load of the first lead can further be reduced.

For example, as illustrated in FIG. 8, the first via connection structure 210 includes a first via H1 located in the insulation structure layer 200 and the first planarization layer 181, and a first conductive structure 212 located in the first via H1. The second via connection structure 220 includes a second via H2 located in the insulation structure layer 200 and the first planarization layer 181, and a second conductive structure 222 located in the second via H2.

In some examples, as illustrated in FIG. 7 and FIG. 8, lengths of the first sub-lead portions 141A of adjacent first leads 141 are approximately equal, so that the uniformity of resistance or load between different first leads can be improved. It should be noted that the above-mentioned "approximately equal" includes the case of complete equality, and also includes the case where the difference between the lengths of the two first sub-lead portions is less than 1/10 of the average length of the two first sub-lead portions.

Figure 9:
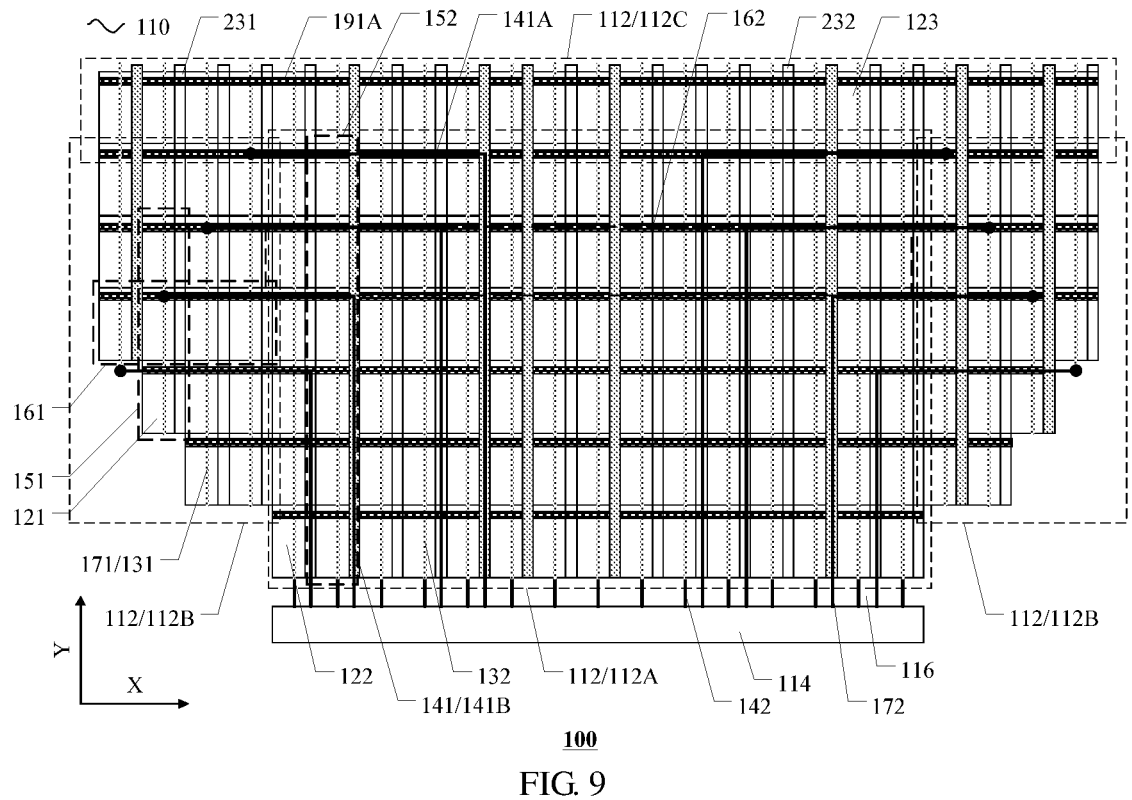
FIG. 9 is a schematic diagram of yet another array substrate provided by an embodiment of the disclosure.

FIG. 9 is a schematic diagram of yet another array substrate provided by an embodiment of the disclosure. As illustrated in FIG. 9, the array substrate 100 further includes a plurality of first power lines 231 and a plurality of second power lines 232; each first power line 231 extends in the second direction; the plurality of first pixel driving circuits 121 are arranged in an array along the first direction X and the second direction Y to constitute a plurality of first pixel driving rows 161 arranged along the second direction; each first pixel driving column 151 extends along the second direction and includes a plurality of first pixel driving circuits 121 arranged along the second direction; each first pixel driving row 161 extends along the first direction and includes a plurality of first pixel driving circuits 121 arranged along the first direction; the second pixel driving circuits 122 are arranged in an array along the first direction X and the second direction Y to constitute a plurality of second pixel driving rows 162 arranged along the second direction Y and a plurality of second pixel driving columns 152 arranged along the first direction X; each second pixel driving column 152 extends along the second direction Y and includes a plurality of second pixel driving circuits 121 arranged along the second direction Y; each second pixel driving row 162 extends along the first direction and includes a plurality of second pixel driving circuits 122 arranged along the first direction. The plurality of first power lines 231 are configured to provide power signals for the plurality of first pixel driving circuit columns 151, and the plurality of second power lines 232 are configured to provide power signals for the plurality of second pixel driving circuit columns 152; the orthographic projection of the first lead 141 on the base substrate 110 at least partially overlaps with an orthographic projection of the second power line 232 on the base substrate 110. Therefore, in the case that the pixels per inch of the array substrate is high, and the size of the first pixel drive circuit cannot be compressed, wiring can be performed by overlapping the first lead and the first pixel drive circuit. Considering that the potential on the power line is usually constant, by allowing the orthographic projection of the first lead on the base substrate to at least partially overlap with the orthographic projection of the power line on the base substrate, the array substrate can realize a larger pixel density and reduce the influence of the first lead on the first pixel driving circuit.

In some examples, as illustrated in FIG. 9, the array substrate 100 further includes a plurality of initialization signal lines 191A configured to provide initialization signals to the plurality of second pixel driving rows 162; for example, each initialization signal line 191A extends in the first direction and is configured to provide the initialization signals to a plurality of second pixel driving circuits 122 in one second pixel driving row 162; the orthographic projection of the first lead 141 on the base substrate 110 at least partially overlaps with the orthographic projection of the initialization signal line 191A on the base substrate 110. Therefore, considering that the potential on the initialization signal line is usually constant, by allowing the orthographic projection of the first lead on the base substrate to at least partially overlap with the orthographic projection of the initialization signal line on the base substrate, the array substrate can realize a larger pixel density and reduce the influence of the first lead on the first pixel driving circuit.

In some examples, as illustrated in FIG. 9, because the initialization signal line 191A extends in the first direction and the second power line 232 extends in the second direction, the orthographic projection of the first sub-lead portion 141A on the base substrate 110 at least partially overlaps with an orthographic projection of the initialization signal line 191A on the base substrate 110, and the orthographic projection of the second sub-lead portion 141B on the base substrate 110 at least partially overlaps with the orthographic projection of the second power line 232 on the base substrate 110.

In some examples, as illustrated in FIG. 9, the array substrate 100 includes a first conductive layer 171, a first planarization layer and a second conductive layer 172; the first conductive layer 171 is located at a side of the first pixel driving circuits 121 away from the base substrate 110; the first planarization layer 181 is located at a side of the first conductive layer 172 away from the first pixel driving circuits 121; the second conductive layer 172 is located at a side of the first planarization layer 181 away from the first conductive layer 171; the plurality of first data lines 131 and the plurality of power lines 230 are all in the first conductive layer 171, and the plurality of first leads 141 are in the second conductive layer 172. Therefore, the first data line and the power line can be formed by the first conductive layer in the array substrate, so that the color cast symmetry of the array substrate can be improved. On the other hand, the first leads can be formed by the second conductive layer in the array substrate, so that the first leads can be manufactured without additional masking process, thereby reducing the cost. In addition, because the square resistance of the second conductive layer itself is small, the load or delay of the first leads can be reduced. It should be noted that for the sake of clarity, the first planarization layer is not illustrated in FIG. 9; the stacking relationship between the first planarization layer, the first conductive layer and the second conductive layer can be seen in FIG. 8.

Figure 10:
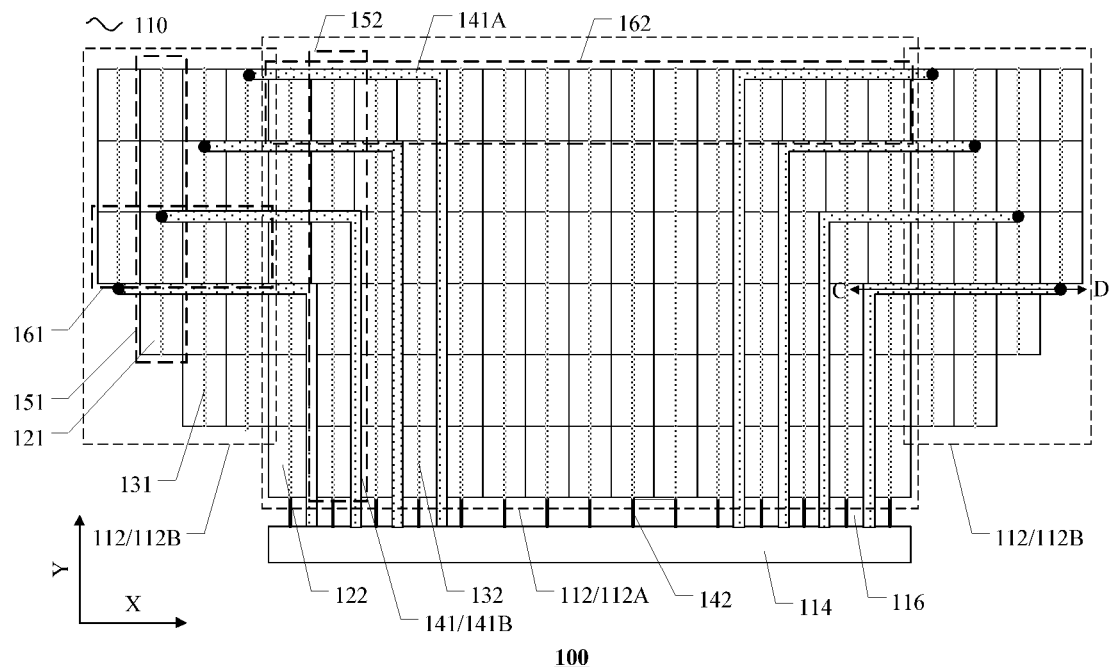
FIG. 10 is a schematic diagram of still array substrate provided by an embodiment of the present disclosure.
Figure 11:
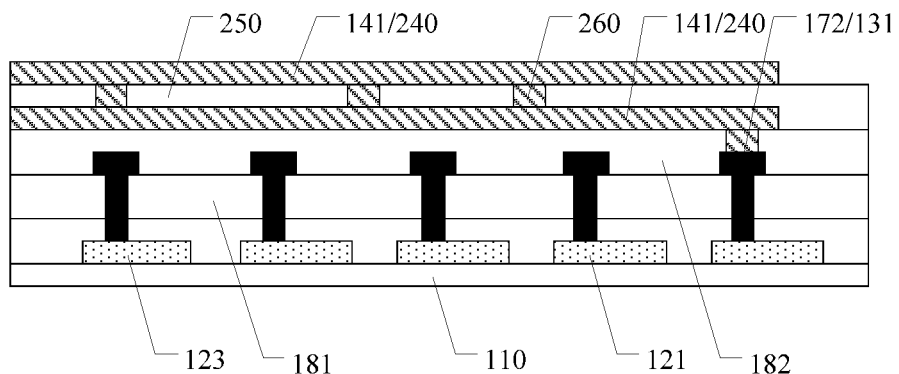
FIG. 11 is a schematic sectional view of an array substrate taken along the direction CD in FIG. 10 provided by an embodiment of the present disclosure.

FIG. 10 is a schematic diagram of further another array substrate provided by an embodiment of the present disclosure; FIG. 11 is a schematic sectional view of an array substrate taken along the direction CD in FIG. 10 provided by an embodiment of the present disclosure.

In some examples, as illustrated in FIG. 10 and FIG. 11, the array substrate 100 further includes a first conductive layer 171, a first planarization layer 181, a second conductive layer 172 and a second planarization layer 182; the first conductive layer 171 is located at a side of the first pixel driving circuits 121 away from the base substrate 110; the first planarization layer 181 is located at a side of the first conductive layer 172 away from the first pixel driving circuits 121; the second conductive layer 172 is located at a side of the first planarization layer 181 away from the first conductive layer 171; the second planarization layer 182 is located at a side of the second conductive layer 172 away from the base substrate 110.

In some examples, as illustrated in FIG. 10 and FIG. 11, the plurality of first data lines 131 are in the first conductive layer 171 or the second conductive layer 172, the plurality of first leads 141 are located at a side of the second planarization layer 182 away from the second conductive layer 172, and a material of the first leads 141 includes a transparent conductive oxide material. Therefore, the first leads can be formed on the side of the second planarization layer away from the base substrate using transparent conductive oxide material in the array substrate, and in this case, there are many layers between the first leads and the first pixel drive circuits, so that the adverse effects such as crosstalk caused by signals on the first leads on the first pixel drive circuits can be reduced. It should be noted that in some products (such as under-screen camera products), a side of the second planarization layer away from the base substrate is provided with films made of a transparent conductive oxide material, and in this case, the above-mentioned first leads can be formed using these films in the array substrate.

For example, the transparent conductive oxide material mentioned above includes indium tin oxide (ITO). Of course, embodiments of the present disclosure include but are not limited to this case, and the transparent conductive oxide material may be other types of transparent conductive oxide materials.

In some examples, as illustrated in FIG. 10 and FIG. 11, each first lead 141 includes at least two transparent conductive layers 240, an interlayer insulation layer 250 and a third via connection structure 260; the at least two transparent conductive layers 240 are stacked in a direction perpendicular to the base substrate 110; the interlayer insulation layer 250 is between two adjacent transparent conductive layers 240; the third via connection structure 260 is located in the interlayer insulation layer 250 to electrically connect the transparent conductive layers 240 respectively on two sides of the interlayer insulation layer 250. Therefore, the first lead can have a multilayer structure, so that the resistance and load of the first lead can be reduced.

FIGS. 12A-12D are schematic diagrams of further another array substrate provided by an embodiment of the present disclosure. As illustrated in FIGS. 12A-12D, the array substrate 100 includes a substrate 110, a plurality of first pixel driving circuits 121, a plurality of second pixel driving circuits 122, M first data lines 131, N second data lines 132, M first leads 141 and N second leads 142; the base substrate 110 includes a display region 112 and a bonding region 114 located at a periphery of the display region 112; the display region 112 includes a first region 112A and a second region 112B located at a side of the first region 112A, and the plurality of first pixel driving circuits 121 are located in the second region 112B; the plurality of first pixel driving circuits 122 are located in the first region 112A.

In some examples, as illustrated in FIGS. 12A-12D, the plurality of first pixel driving circuits 121 are arranged in an array along the first direction X and the second direction Y to constitute a plurality of first pixel driving columns 151 arranged along the first direction X, and each first pixel driving column 151 extends along the second direction Y; that is, a plurality of first pixel driving circuits 121 in each first pixel driving column 151 are arranged along the second direction Y. The M first data lines 131 are configured to provide data signals to the plurality of first pixel driving columns 151, and the M first leads 141 are respectively connected to the M first data lines 131, pass through the first region 112A from the second region 112B and then extend to the bonding region 114. The plurality of second pixel driving circuits 122 are arranged in an array along the first direction X and the second direction Y to constitute a plurality of second pixel driving columns 152 arranged along the first direction X, and each second pixel driving column 152 extends along the second direction Y. The N second data lines 132 are configured to provide data signals to the plurality of second pixel driving columns 152, and the N second leads 142 are respectively connected with the n second data lines 132 and extend from the first region 112A to the bonding region 114.

In some examples, as illustrated in FIGS. 12A-12D, each first lead 141 includes a first sub-lead portion 141A and a second sub-lead portion 141; the first sub-lead portion 141A extends in the first direction X, and the second sub-lead portion 141B extends in the second direction Y. Among the N second leads 142, in a direction from the second region 112B to the first region 112A, the second lead 142 connected to a j-th second data line 132 is a j-th second lead 142, and j is a positive integer greater than or equal to 1 and less than or equal to M; the j-th second lead 142 includes a third sub-lead portion 142A and a fourth sub-lead portion 142B, the third sub-lead portion 142A is located in the first region 112A and extends in the first direction, and the fourth sub-lead portion 142B is connected with the third sub-lead portion 142A and extends from the first region 112A to the bonding region 114 in the second direction. Therefore, by arranging the second lead to include the third sub-lead portion and the fourth sub-lead portion, the array substrate can translate the position where the second lead extends from the first region.

In some examples, as illustrated in FIGS. 12A-12D, among the plurality of first leads 141, the first lead 141 connected to a j-th first data line 131 is a j-th first lead 141; the orthographic projection of a (j+1)-th first lead 141 on the base substrate 110 is at a side of the orthographic projection of the j-th first lead 141 on the base substrate 110 away from the second region 112B; an orthographic projection of the fourth sub-lead portion 142B of the 1-st second lead 142 on the base substrate 110 is at a side of an orthographic projection of the second sub-lead portion 141B of the M-th first lead 141 on the base substrate 110 away from the second region 112B, and an orthographic projection of the fourth sub-lead portion 142B of a (j+1)-th second lead 142 on the base substrate 110 is at a side of an orthographic projection of the j-th second lead 142 on the base substrate 110 away from the second region. Therefore, the array substrate can enable the order of the second sub-lead portion of the first lead and the fourth sub-lead portion of the second lead to be the same as that of the first data line and the second data line in the display region, so that the structure or driving method of the driver IC do not need to be adjusted, and thus the cost can be reduced.

In some examples, as illustrated in FIGS. 12A-12D, two second sub-lead portions 141B or two fourth sub-lead portions 142B may be arranged between two adjacent first pixel driving columns 152, so that the order of the second sub-lead portion of the first lead and the fourth sub-lead portion of the second lead is the same as that of the first data line and the second data line in the display region. Of course, embodiments of the present disclosure include, but are not limited to this case, more second sub-lead portions or more fourth sub-lead portions may be arranged between two adjacent first pixel driving columns.

Figure 12A:
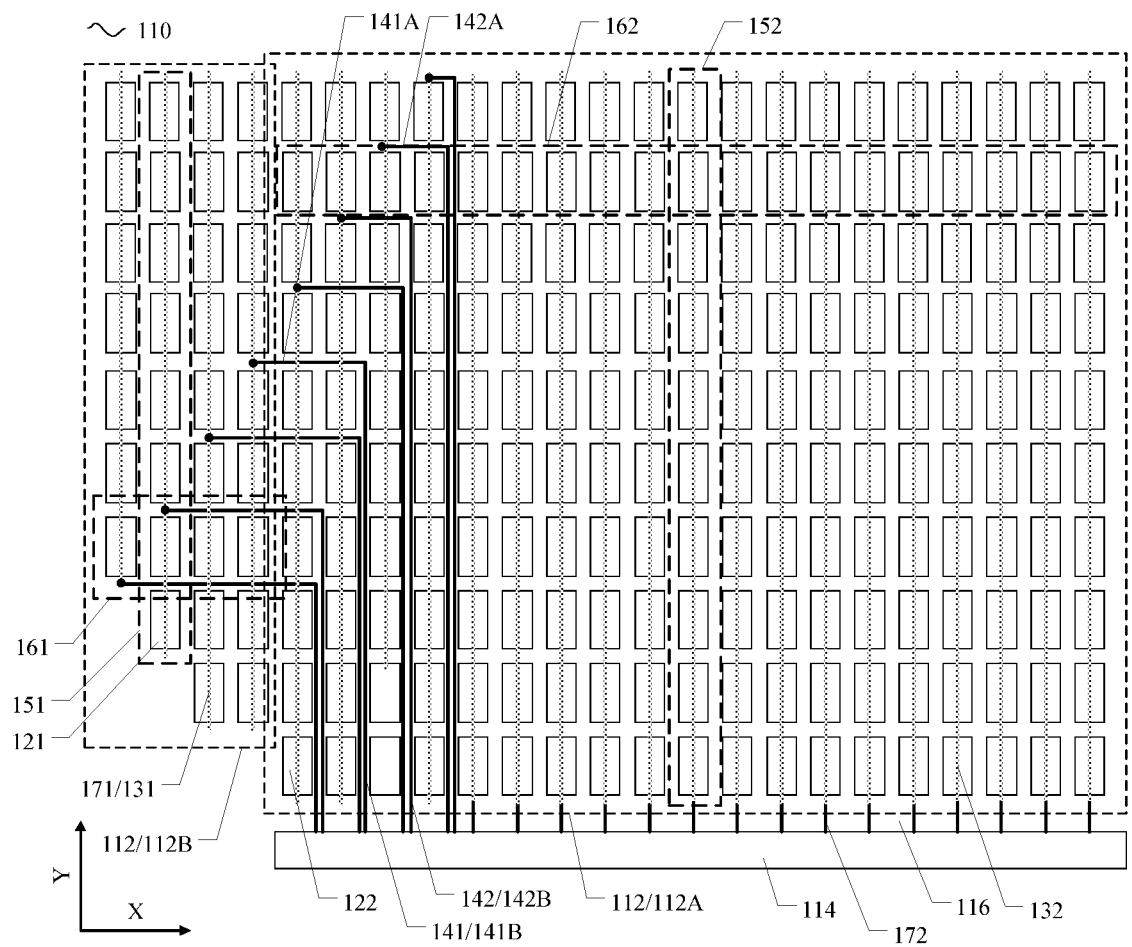
FIG. 12A is a schematic diagram of further another array substrate provided by an embodiment of the disclosure.

In some examples, as illustrated in FIG. 12A, the size of the first pixel driving circuit 121 and the size of the second pixel driving circuit 122 are both reduced, thus forming the above-mentioned first interval S1 and second interval S2; in this case, an orthographic projection of the first sub-lead portion 141A of the first lead 141 on the base substrate 110 is located in the first interval S1, and the first sub-lead portions 141A corresponding to the first pixel driving columns 151 in a direction from the second region 112B to the first region 112A are sequentially arranged in the direction from the bonding region 114 to the display region 112. It should be noted that the size reduction design of the first pixel driving circuit and the second pixel driving circuit can be referred to the related description of FIG. 3A, which is not repeated here.

Figure 12B:
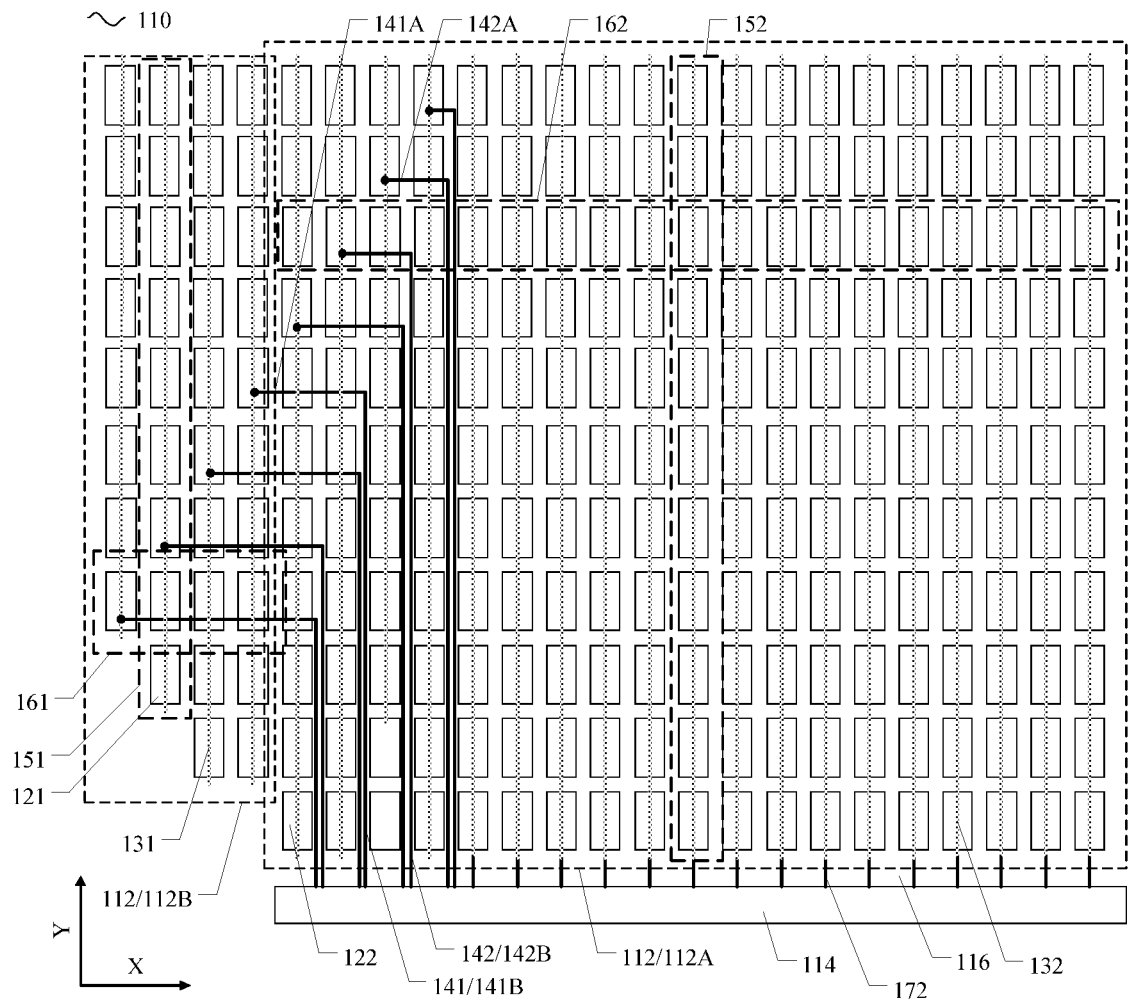
FIG. 12B is a schematic diagram of further another array substrate provided by an embodiment of the present disclosure.

In some examples, as illustrated in FIG. 12B, an orthographic projection of the first sub-lead portion 141A of the first lead 141 on the base substrate 110 may also overlap with an orthographic projection of the first pixel driving circuit 121 on the base substrate 110.

Figure 12C:
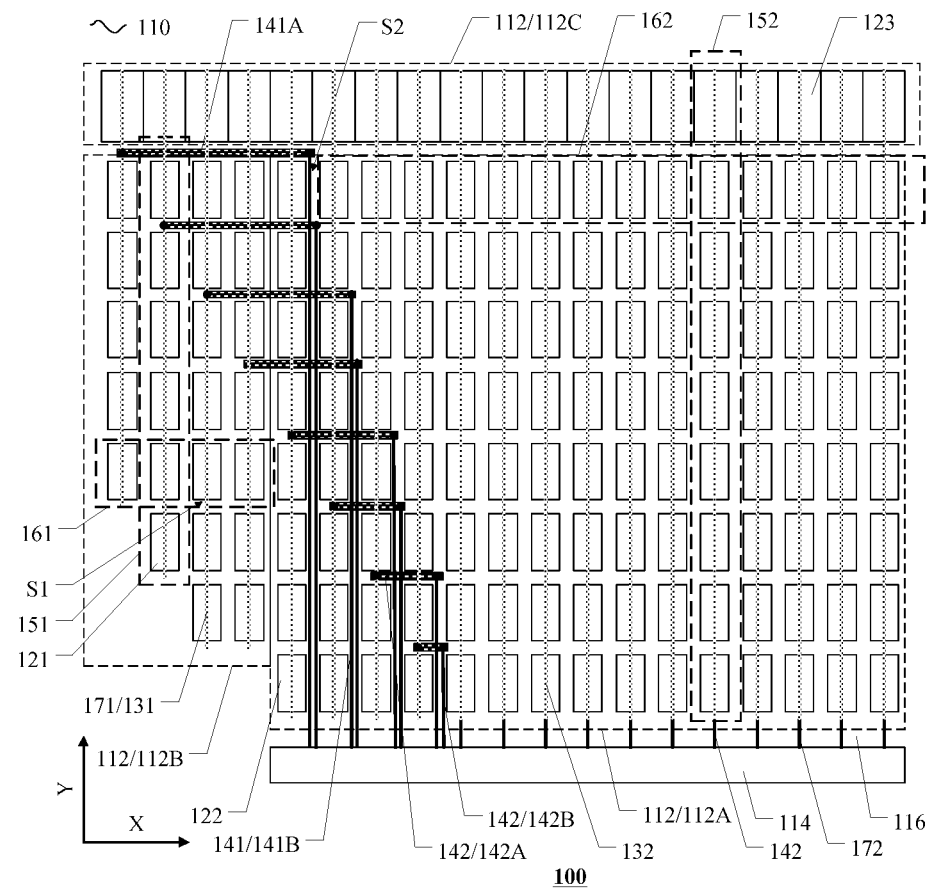
FIG. 12C is a schematic diagram of further another array substrate provided by an embodiment of the present disclosure.

In some examples, as illustrated in FIG. 12C, in the array substrate 100, the first leads 141 may be routed utilizing the gate layer 190, so that the first leads 141 can cross the signal lines located in the first conductive layer 171 and the second conductive layer 172. In this case, and the first sub-lead portions 141A corresponding to the first pixel driving columns 151 in the direction from the second region 112B to the first region 112A are sequentially arranged along the direction from the display region 112 to the bonding region 114, so that a part of the display region 112 close to the bonding region 114 (that is, the lower part in FIG. 12C) can be fully utilized for routing.

Figure 12D:
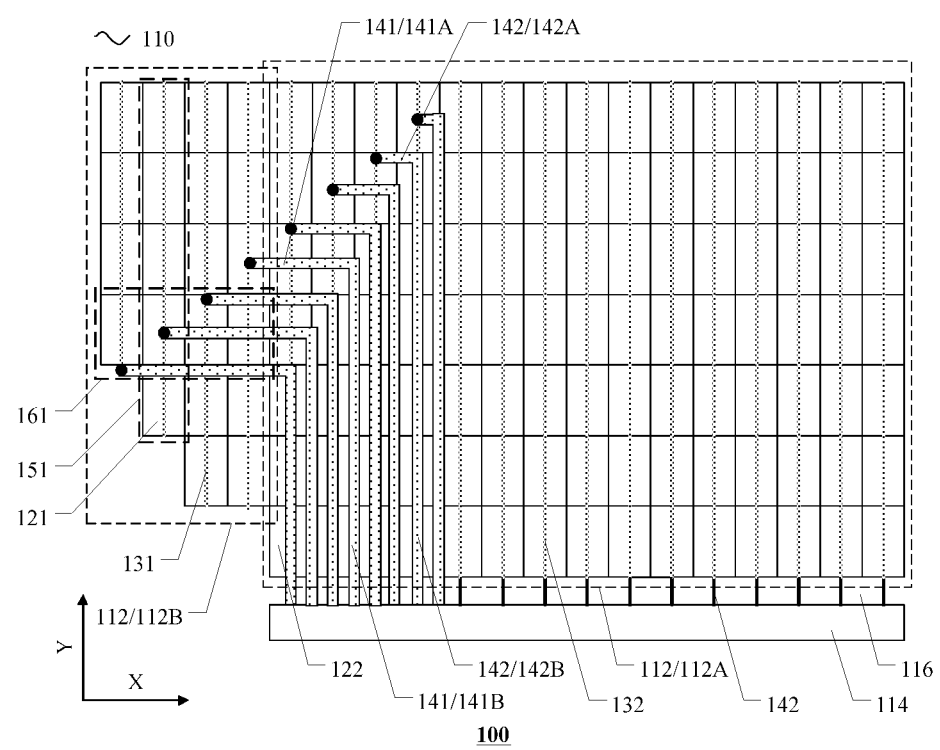
FIG. 12D is a schematic diagram of further another array substrate provided by an embodiment of the disclosure.

In some examples, as illustrated in FIG. 12D, in the array substrate 110, the first leads 141 may be routed utilizing a transparent conductive oxide (such as ITO) layer. In this case, there are many layers between the first leads and the first pixel drive circuits, which can reduce the adverse effects such as crosstalk caused by the signals on the first leads to the first pixel drive circuits. Therefore, the first lead 141 can be routed more flexibly, so that the order of the second sub-lead portion of the first lead and the fourth sub-lead portion of the second lead is the same as that of the first data line and the second data line in the display region.

Figure 13:
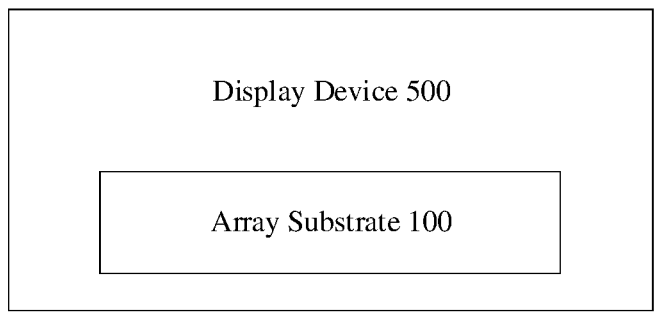
FIG. 13 is a schematic diagram of a display device provided by an embodiment of the present disclosure.

At least one embodiment of the present disclosure further provides a display device. FIG. 13 is a schematic diagram of a display device provided by an embodiment of the present disclosure. As illustrated in FIG. 13, the display device 500 includes the array substrate 100 described above.

In the array substrate included in the display device, the first leads may pass through the first region from the second region and then extend to the bonding region, without directly extending from the second region to the bonding region, so the array substrate does not need to be provided with a wider frame outside the second region, thereby achieving a narrow frame or even no frame design outside the second region. In addition, because the plurality of first leads can directly extend from the first region to the bonding region without being bent outside the first region, the width of the frame outside the first region can also be reduced. Therefore, the display substrate has a smaller frame width at the side of the display region close to the bonding region, so that the narrow frame design and ultra-narrow frame design can be achieved. On the other hand, because the display substrate has a narrow frame outside the second region, and the frame position is not provided with the first lead, the second region of the display substrate can be bent at a large angle. Because the array substrate can achieve the narrow frame design and ultra-narrow frame design, the display device can also achieve the narrow frame design and ultra-narrow frame design. In addition, because the array substrate can realize the "four-curved-surface screen" design, and can also avoid wrinkles in the subsequent module bonding process, and the array substrate has a high product yield, therefore the display device can also realize the "four-curved-surface screen" design, and has a high product yield.

For example, in some examples, the display device may be any product or component with display function such as smart phone, tablet computer, TV set, monitor, notebook computer, digital photo frame, navigator, etc.

The following statements should be noted:

(1) The accompanying drawings involve only the structure(s) in connection with the embodiment(s) of the present disclosure, and other structure(s) can be referred to common design(s).

(2) In case of no conflict, the features in a same embodiment and in different embodiments of the present disclosure can be combined with each other.

What have been described above are only specific implementations of the present disclosure, but the protection scope of the present disclosure is not limited thereto, and changes or substitutions that can be easily conceive should be covered within the protection scope of the present disclosure. Therefore, the protection scope of the present disclosure should be based on the protection scope of the claims.

What is claimed is:

1. An array substrate, comprising:
   a base substrate, comprising a display region and a bonding region at a periphery of the display region;
   a plurality of first pixel driving circuits on the base substrate;
   M first data lines; and
   M first leads,
   wherein the display region comprises a first region and a second region at a side of the first region, and the plurality of first pixel driving circuits are in the second region,
   the plurality of first pixel driving circuits are arranged in an array along a first direction and a second direction to constitute a plurality of first pixel driving columns arranged along the first direction, the first region and the second region are arranged in the first direction, the M first data lines are configured to provide data signals to the plurality of first pixel driving columns, the M first leads are respectively connected with the M first data lines, pass through the first region from the second region and extend to the bonding region, and M is a positive integer greater than or equal to 2, the array substrate further comprises a plurality of second pixel driving circuits in the first region, each of the first leads comprises: a first sub-lead portion extending from the second region to the first region along the first direction; and a second sub-lead portion extending from the first region to the bonding region along the second direction, the plurality of first pixel driving circuits are arranged in an array along the first direction and the second direction to constitute a plurality of first pixel driving rows arranged along the second direction, the plurality of second pixel driving circuits are arranged in an array along the first direction and the second direction to constitute a plurality of second pixel driving columns arranged along the first direction and a plurality of second pixel driving rows arranged along the second direction, a first interval is formed between two of the first pixel driving rows that are adjacent in the second direction, and a second interval is formed between two of the second pixel driving columns that are adjacent in the first direction, and an orthographic projection of each of the first leads on the base substrate at least partially overlaps with an orthographic projection of the first interval and an orthographic projection of the second interval on the base substrate, an orthographic projection of the first sub-lead portion on the base substrate at least partially overlaps with the orthographic projection of the first interval on the base substrate, an orthographic projection of the second sub-lead portion on the base substrate at least partially overlaps with the orthographic projection of the second interval on the base substrate, wherein, in the second direction, the first region and the second region are edge parts of the display region, the display region comprises a third region, the third region is on a side of the first region away from the bonding region, and the array substrate further comprises a third pixel driving circuit which is in the third region, a size of each of the second pixel driving circuits in the first direction is smaller than a size of the third pixel driving circuit in the first direction, so as to form the first interval, and a size of each of the first pixel driving circuits in the second direction is smaller than a size of the third pixel driving circuit in the second direction, so as to form the second interval.

2. The array substrate according to claim 1, wherein the second region is closer to an edge of the array substrate than the first region in the first direction.

3. The array substrate according to claim 2, wherein an edge of an orthographic projection of the second region on the base substrate comprises a curve, and the curve is connected with an edge extending along the first direction of an orthographic projection of the first region on the base substrate.

4. The array substrate according to claim 1, wherein a first overlapping area of an orthographic projection of the bonding region on a reference line extending along the first direction and an orthographic projection of the first region on the reference line is larger than a second overlapping area of the orthographic projection of the bonding region on the reference line extending along the first direction and an orthographic projection of the second region on the reference line.

5. The array substrate according to claim 1, wherein the base substrate further comprises a bending region between the first region and the bonding region, and the bending region is bent so that the bonding region and the first region are respectively on two sides of the base substrate in a third direction, and the third direction is perpendicular to both the first direction and the second direction.

6. The array substrate according to claim 1, further comprising:
a plurality of initialization signal lines, extending along the first direction,
wherein the plurality of initialization signal lines are configured to provide initialization signals to the plurality of second pixel driving rows, and the orthographic projection of each first lead on the base substrate at least partially overlaps with an orthographic projection of one of the initialization signal lines on the base substrate.

7. The array substrate according to claim 6, wherein an orthographic projection of the first sub-lead portion on the base substrate at least partially overlaps with the orthographic projection of one of the initialization signal lines on the base substrate.

8. The array substrate according to claim 7, wherein, in the display region, the orthographic projection of the first sub-lead portion on the base substrate falls within the orthographic projection of one of the initialization signal lines on the base substrate.

9. The array substrate according to claim 1, further comprising: a first conductive layer, at a side of the plurality of first pixel driving circuits away from the base substrate; a first planarization layer, at a side of the first conductive layer away from the plurality of first pixel driving circuits; and a second conductive layer, at a side of the first planarization layer away from the first conductive layer, wherein the plurality of first data lines and the plurality of power lines are all in the first conductive layer, and the first leads are in the second conductive layer.

10. The array substrate according to claim 1, further comprising:
a first conductive layer, at a side of the plurality of first pixel driving circuits away from the base substrate;
a first planarization layer, at a side of the first conductive layer away from the plurality of first pixel driving circuits;
a second conductive layer, at a side of the first planarization layer away from the first conductive layer; and
a second planarization layer, at a side of the second conductive layer away from the first planarization layer,
wherein the plurality of first data lines are in the first conductive layer or the second conductive layer, the first leads are at a side of the second planarization layer away from the second conductive layer, and a material of the first leads comprises a transparent conductive oxide material.

11. The array substrate according to claim 1, further comprising:
N second data lines, in the first region; and
N second leads,
wherein the plurality of second pixel driving circuits are arranged in an array along the first direction and the second direction to constitute a plurality of second pixel driving columns arranged along the first direction and a plurality of second pixel driving rows arranged along the second direction, the N second data lines are configured to provide data signals to the plurality of second pixel driving columns, and the N second leads are respectively connected with the N second data lines and extend from the first region to the bonding region, where N is a positive integer greater than or equal to M.

12. The array substrate according to claim 11, wherein among the N second leads, in a direction from the second region to the first region, the second lead connected to a j-th second data line of the N second data lines is a j-th second lead, and j is a positive integer greater than or equal to 1 and less than or equal to M, the j-th second lead comprises:
a third sub-lead portion, in the first region and extending along the first direction; and
a fourth sub-lead portion, connected with the third sub-lead portion and extending from the first region to the bonding region along the second direction.

13. The array substrate according to claim 12, wherein among the M first leads, the first lead connected to a j-th first data line of the M first data lines is a j-th first lead, an orthographic projection of the second sub-lead portion of a (j+1)-th first lead on the base substrate is at a side of an orthographic projection of the second sub-lead portion of the j-th first lead on the base substrate away from the second region, an orthographic projection of the fourth sub-lead portion of the 1-st second lead on the base substrate is at a side of an orthographic projection of the second sub-lead portion of an M-th first lead on the base substrate away from the second region, and an orthographic projection of the fourth sub-lead portion of the (j+1)-th second lead on the base substrate is at a side of an orthographic projection of the fourth sub-lead portion of the j-th second lead on the base substrate away from the second region.

14. A display device, comprising the array substrate according to claim 1.

15. The array substrate according to claim 1, wherein a size of each of the second pixel driving circuits in the second direction is smaller than a size of the third pixel driving circuit in the second direction, and a size of each of the first pixel driving circuits in the first direction is smaller than a size of the third pixel driving circuit in the first direction.

16. The array substrate according to claim 1, wherein the array substrate further comprises:
a plurality of first power lines, extending along the second direction; and
a plurality of second power lines, extending along the second direction,
wherein the plurality of second pixel driving circuits are arranged in an array along the first direction and the second direction to constitute a plurality of second pixel driving rows arranged along the second direction and a plurality of second pixel driving columns arranged along the first direction, the plurality of first power lines are configured to provide power signals to the plurality of first pixel driving columns, and the plurality of second power lines are configured to provide power signals to the plurality of second pixel driving columns,
an orthographic projection of the second sub-lead portion of each of the first leads on the base substrate at least partially overlaps with an orthographic projection of one of the second power lines.

17. The array substrate according to claim 1, wherein lengths of first sub-lead portions of adjacent ones of the first leads are approximately equal.

* * * * *